United States Patent [19]
Wilsher et al.

[11] Patent Number: 5,905,577
[45] Date of Patent: *May 18, 1999

[54] DUAL-LASER VOLTAGE PROBING OF IC'S

[75] Inventors: Kenneth R. Wilsher, Palo Alto; Suresh N. Rajan; William K. Lo, both of San Jose, all of Calif.

[73] Assignee: Schlumberger Technologies, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/818,345

[22] Filed: Mar. 15, 1997

[51] Int. Cl.⁶ .................................................. G01R 31/265
[52] U.S. Cl. ........................................... 356/448; 324/752
[58] Field of Search .................................... 356/445, 448; 324/752

[56] References Cited

U.S. PATENT DOCUMENTS

| | | |
|---|---|---|
| 4,681,449 | 7/1987 | Bloom et al. . |
| 4,758,092 | 7/1988 | Heinrich et al. . |
| 5,210,487 | 5/1993 | Takahashi et al. . |

OTHER PUBLICATIONS

H. Heinrich et al., Picosecond, backside optical detection of internal signals in flip–chip mounted silicon VLSI Circuits, 3RD European Conference on Electron and Optical Beam Testing of Integrated Circuits, Sep. 9–11, 1991, Como, Italy, pp. 261–274.

N. Seliger et al., A Study of Backside Laser–Probe Signals in MOSFETs, 5TH European Conference on Electron and Optical Beam Testing of Electronic Devices: Preliminary Proceedings, Aug. 27–30, 1995, Wuppertal, Germany, 8 pages.

M. Shinagawa et al., A Novel High–Impedance Probe for Multi–Gigahertz Signal Measurement, IEEE Transactions on Instrumentation and Measurement, vol. 45, No. 2, Apr. 1996, pp. 575–579.

*Primary Examiner*—Robert Kim
*Attorney, Agent, or Firm*—Bruce D. Riter

[57] ABSTRACT

A probe beam is used to sample the waveform on an IC device under test (DUT) during each cycle of a test pattern applied to the DUT. A reference laser beam is also used to sample the DUT. For each cycle of the test pattern, the reference and probe beams sample the DUT at the same physical location, but at displaced times with respect to each other. Each reference measurement is made at a fixed time relative to the test pattern while the probe measurements are scanned through the test-pattern time portion of interest, in the manner normal to equivalent time sampling, to reconstruct the waveform. For each test cycle, the ratio of these two measurements is taken. The fluctuations of these ratios due to noise is greatly reduced as compared to fluctuations of the probe measurements taken alone. Thus, a smaller number of averages is required to reconstruct the waveform.

30 Claims, 12 Drawing Sheets ically-reflected beam to pass to detector 160, but intercepts the non-confocally-reflected beam. Detector 160 thus sees only the beam confocally reflected from focal plane 135 of DUT 130.

DUAL-LASER VOLTAGE PROBING OF IC'S

BACKGROUND OF THE INVENTION

1. Field of the Invention

The present invention relates to methods and apparatus for probing of an IC (integrated circuit) device with a dual-laser voltage probe.

2. The Prior Art

Optical-probe test systems typically operate by focusing a laser beam using lenses onto an IC device under test (DUT) and detecting the reflected beam. The laser-beam sampling pulses are generated at a wavelength at which silicon is effectively transparent. A confocal optical system allows a shallow focal plane to be precisely positioned relative to structure of the DUT to be investigated.

FIG. 1 illustrates schematically the principal of a prior-art confocal laser-beam probe system. Laser source 100 generates an incident beam 105 which passes through a beam splitter 110 via steerable galvo-mirrors 115, a scan lens 120 and an objective lens 125 to a DUT 130. The beam confocally-reflected from a focal plane 135 is shown in solid lines 140, while the non-confocally-reflected beam is shown in dashed lines 145. These reflected beams pass via objective lens 125, scan lens 120, galvo-mirrors 115, beam splitter 110 and lens 150. Confocal aperture 155 allows the confocally-reflected beam to pass to detector 160, but intercepts the non-confocally-reflected beam. Detector 160 thus sees only the beam confocally reflected from focal plane 135 of DUT 130.

FIG. 2 shows schematically the manner in which the probe in a confocal laser-beam probe system is scanned in three dimensions to examine regions of interest within a sample. Galvo-mirrors 115 are steerable about two axes in the $\phi$ and $\theta$ directions so as to scan the incident beam in X- and Y-directions in a raster scan pattern 200 over a scan-lens back focal plane 205. The incident beam is thus scanned in a corresponding demagnified pattern 210 over the DUT 130 after passing through objective lens 125. A beam expander 210 comprising a pair of lenses 215 and 220 and a pinhole aperture 225 provide spatial filtering of the incident laser beam 105 to approximate point source illumination. The incident beam is focused in the Z-direction by moving the sample as indicated at 230.

Due to DUT interactions with the beam, the reflected beam carries information about the DUT. This information can take the form of reflected beam amplitude, phase and/or polarization modulations, for example. These modulations may be due to changes in the DUT charge state, electric field strength, and/or temperature, caused by application of a test pattern to the DUT, for example. In order to detect phase and polarization modulations, it is usual to first convert them into an amplitude modulation. This can be done for polarization modulations by passing the beam through a beam polarizer. For a phase modulated beam, this can be done using interference techniques. Amplitude modulations can then be detected as intensity modulations using a photodetector. To increase the measurement bandwidth, equivalent time sampling techniques are used in which either the laser or the photodetector is pulsed/gated and the DUT test pattern is made repetitive.

Problems arise when effects other than the one being probed result in unwanted modulations of the beam amplitude. For example, temperature changes as well as electrical field strength changes in the DUT may cause amplitude changes in the reflected probe beam. If only electrical field strength changes are of interest, the temperature changes behave as a source of noise in the measurement.

Other sources of noise may be present. FIGS. 3A–3C illustrate one source caused by fluctuations in the overlap between the incident probe beam spot and the active regions of the DUT under study. This might result from movement of the beam focusing lenses relative to the DUT, caused by external mechanical vibrations, for example. It might also result from electronic noise in the drivers to the beam steering optics. FIG. 3A illustrates this variation in overlap 300 between the laser probe beam spot 305 and a region 310 to be probed, as might be seen when looking along the beam direction at the DUT. A sinusoidal variation 315 of overlap vs. time is shown for simplicity; the actual motion and resulting noise variation are likely to be more complicated. FIG. 3B illustrates at 320 the effect of noise due to overlap variation on the reflected intensity of the beam, assuming that the active region of the DUT has a higher reflectivity than its surroundings. FIG. 3C illustrates the reflected intensity variation 325 due to both the noise 320 and the signal of interest (e.g., charge density variation in the DUT due an applied test pattern).

If the noise is random with respect to the test pattern, it is common practice to time-average the measurements over a number of test pattern cycles to increase the signal-to-noise ratio (SIN). However, it may take a large number of samples to average out the noise sufficiently since the signal-to-noise ratio is proportional to the square-root of the number of measurements averaged, i.e., S/N $\alpha$ sqrt(n). For example, if the noise fluctuations are initially 100 times larger in amplitude than the signal (S/N=0.01), it would take 10,000 samples to increase the signal to noise level to 1 (0.01×sqrt (10,000)=1). Since the interactions of interest may only modulate the reflected beam intensities by 0.01, a noise amplitude of just 10% (S/N=0.001) is problematic.

Improved schemes are need to compensate for much of this noise, such that the number samples to be averaged to obtain adequate signal-to-noise ratio is reduced.

SUMMARY OF THE INVENTION

Preferred embodiments of the invention offer methods and apparatus for probing an integrated circuit device with laser light to acquire samples of a waveform appearing on the device as the device is exercised by a repetitive pattern of test vectors.

A probe beam is used to sample the waveform on an IC device under test (DUT) during each cycle of a test pattern applied to the DUT. A reference laser beam is also used to sample the DUT. For each cycle of the test pattern, the reference and probe beams sample the DUT at the same physical location, but at displaced times with respect to each other. Each reference measurement is made at a fixed time relative to the test pattern while the probe measurements are scanned through the test-pattern time portion of interest, in the manner normal to equivalent time sampling, to reconstruct the waveform. For each test cycle, the ratio of these two measurements is taken. The fluctuations of these ratios due to noise is greatly reduced as compared to fluctuations of the probe measurements taken alone. Thus, a smaller number of averages is required to reconstruct the waveform. Fluctuations in incident-energy are also preferably compensated.

These and other features of the invention will become apparent to those of skill in the art from the following description and the accompanying drawing figures.

DETAILED DESCRIPTION

Laser-voltage probing methods and apparatus are provided which compensate for much of the noise described above with reference to FIGS. 3A–3C, greatly reducing the number of averages required to obtain a desired signal-to-noise ratio. A time-equivalent sampling scheme is used in which the laser beam is pulsed rather than gating the detector. In addition to a probe beam, a reference-laser beam is used to sample the DUT waveform during each cycle of the test pattern applied to the DUT. For each cycle, the reference and probe beams sample the DUT at the same physical location, but at displaced times with respect to each other. Each reference measurement is made at a fixed point in time in the test pattern while the probe measurements are scanned in time through the portion of the test pattern of interest, in the manner normal to equivalent time sampling, to reconstruct the waveform. For each test cycle, the ratio of these two measurements is taken. The fluctuations of these ratios due to noise is greatly reduced compared to fluctuations of the probe measurements taken alone. Thus, a smaller number of averages is required to reconstruct a sampled waveform.

Figures 4A, 4B:
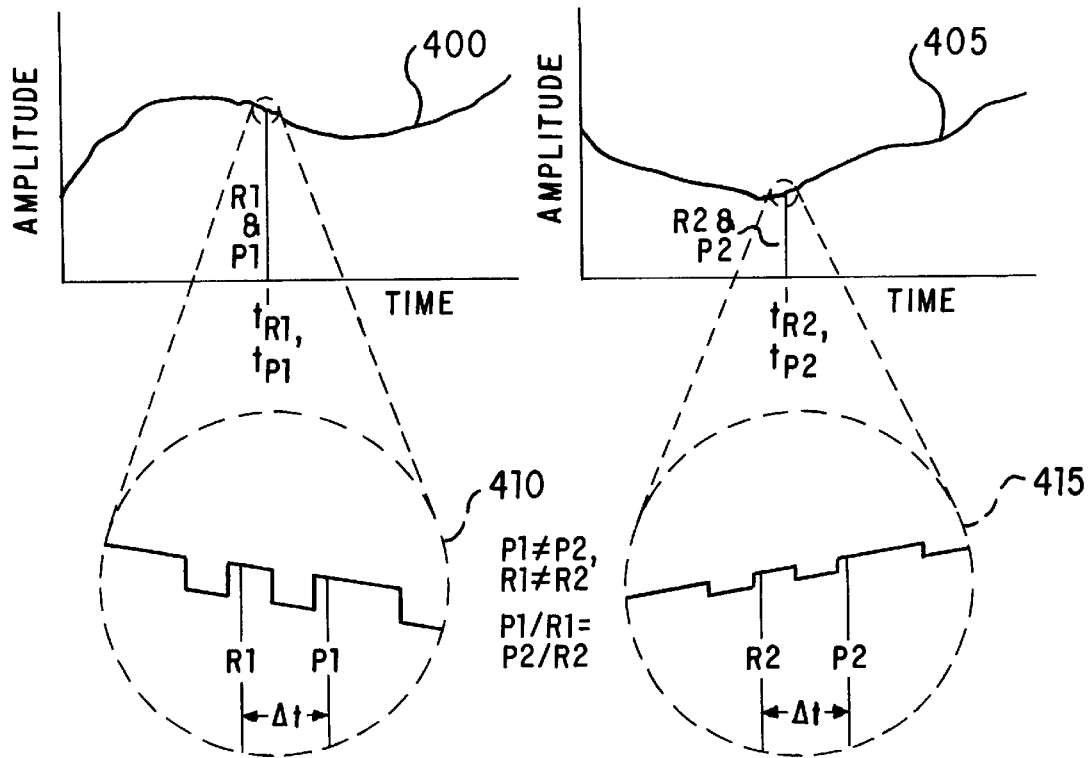
FIGS. 4A and 4B show how noise may be canceled using two laser pulses in accordance with the invention.

This is illustrated by FIGS. 4A and 4B. Plots 400 and 405 represent the reflected amplitude of a beam of light incident on an active region of the DUT for two cycles of an applied test pattern in the presence of random noise. The signal-to-noise ratio is shown to be much less than 1 (S/N<<1) as is likely to occur in an actual measurement. Insets 410 and 415 show expanded views of identical portions of the test pattern for the two different test cycles. R and P are the amplitudes sampled by the reference and probe beams at times $t_R$ and $t_P$, respectively. Due to the noise, R and P may vary between test cycles by as much as the uncorrected noise amplitude. This noise variation must be averaged to obtain a desired signal-to-noise ratio. However, the ratio P/R can be made to vary by much less over the test cycles, so that the desired signal-to-noise ratio can be achieved with averaging of far fewer samples.

The probe beam samples the reflected amplitude at times $t_{Pi}$ in the test pattern to give amplitudes $P_i$ ($1 \leq i \leq n$). These values vary greatly due to noise, as shown, and an accurate measurement of the signal at this point in the waveform would require a large number of samples to be averaged. A reference beam samples the reflected amplitude at times $t_{Ri}$ to give amplitudes $R_i$. These values also vary greatly due to noise. However, variations due to noise of the ratios $P_i/R_i$ are seen to be very much reduced, and an accurate measurement of these ratios can be made with far less averaging required. That is, for $P_1 \neq P_2$ and $R_1 \neq R_2$, $P_1/R_1 \approx P_2/R_2$ provided that:

1. The reference-laser and probe-laser pulses are focused to the same spot on the DUT. This can be accomplished by guiding the pulses from both the reference laser and the probe laser through a polarization-preserving, single-mode optical fiber before the probe forming optics. The single-mode fiber ensures that the spatial characteristics of the reference-laser pulses and the probe-laser pulses are identical at the exit of the fiber regardless of their characteristics at the input if the two lasers operate at the same wavelength.

Figure 5:
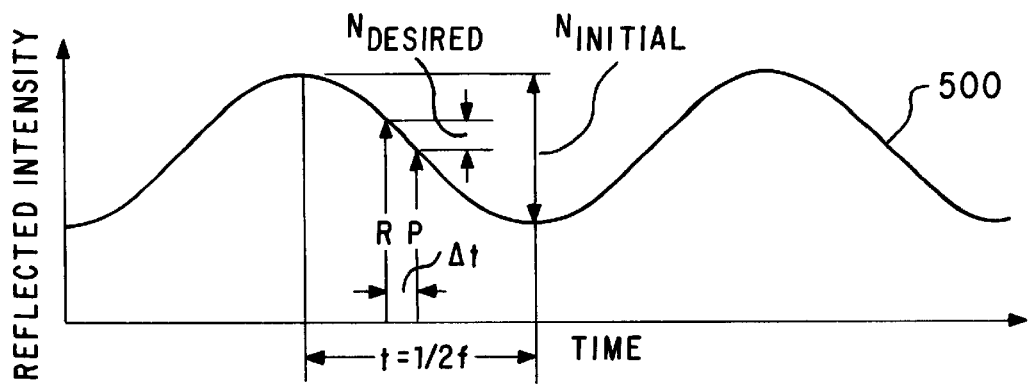
FIG. 5 illustrates calculation of the maximum time interval allowed between reference and probe sampling for a desired reduction in noise amplitude.

2. Variations due to noise are slow compared to the time interval between the reference pulse and the probe pulse for a given cycle of the test loop. This ensures that pulses from the reference laser and the probe laser sample the active region of the DUT with nearly identical noise amplitude. How slow this needs to be depends on the maximum noise frequency, the initial signal-to-noise ratio, and the signal-to-noise ratio desired. Given an initial noise amplitude $N_{initial}$ and maximum frequency f, the maximum time interval $\Delta t$ allowed for achieving a desired noise amplitude $N_{desired}$ in accordance with the scheme of the present invention can be estimated from FIG. 5, where $\omega = 2\pi f$. Assuming a sinusoidal noise variation as shown at 500 in FIG. 5, $$N_{desired} = \frac{d}{dt}[N_{initial}\sin(\omega t)] \times \Delta t = N_{initial}\omega\cos(\omega t) \times \Delta t$$

or $$\Delta t = \frac{1}{\omega\cos(\omega t)} \frac{N_{desired}}{N_{initial}} = \frac{1}{\omega\cos(\omega t)} \frac{S/N_{initial}}{S/N_{desired}}$$

$$= \frac{1}{2\pi f \cos(\omega t)} \frac{S/N_{initial}}{S/N_{desired}}$$

In the worst case, $\cos(\omega t) = 1$, so that $$\Delta t = \frac{1}{2\pi f}\left(\frac{S/N_{initial}}{S/N_{desired}}\right)$$

For example, if $S/N_{initial} = 0.01$, $S/N_{desired} = 1$, and f=10 KHz, then $\Delta t \approx 0.16 \times 10^{-6}$ seconds.

Figure 1:
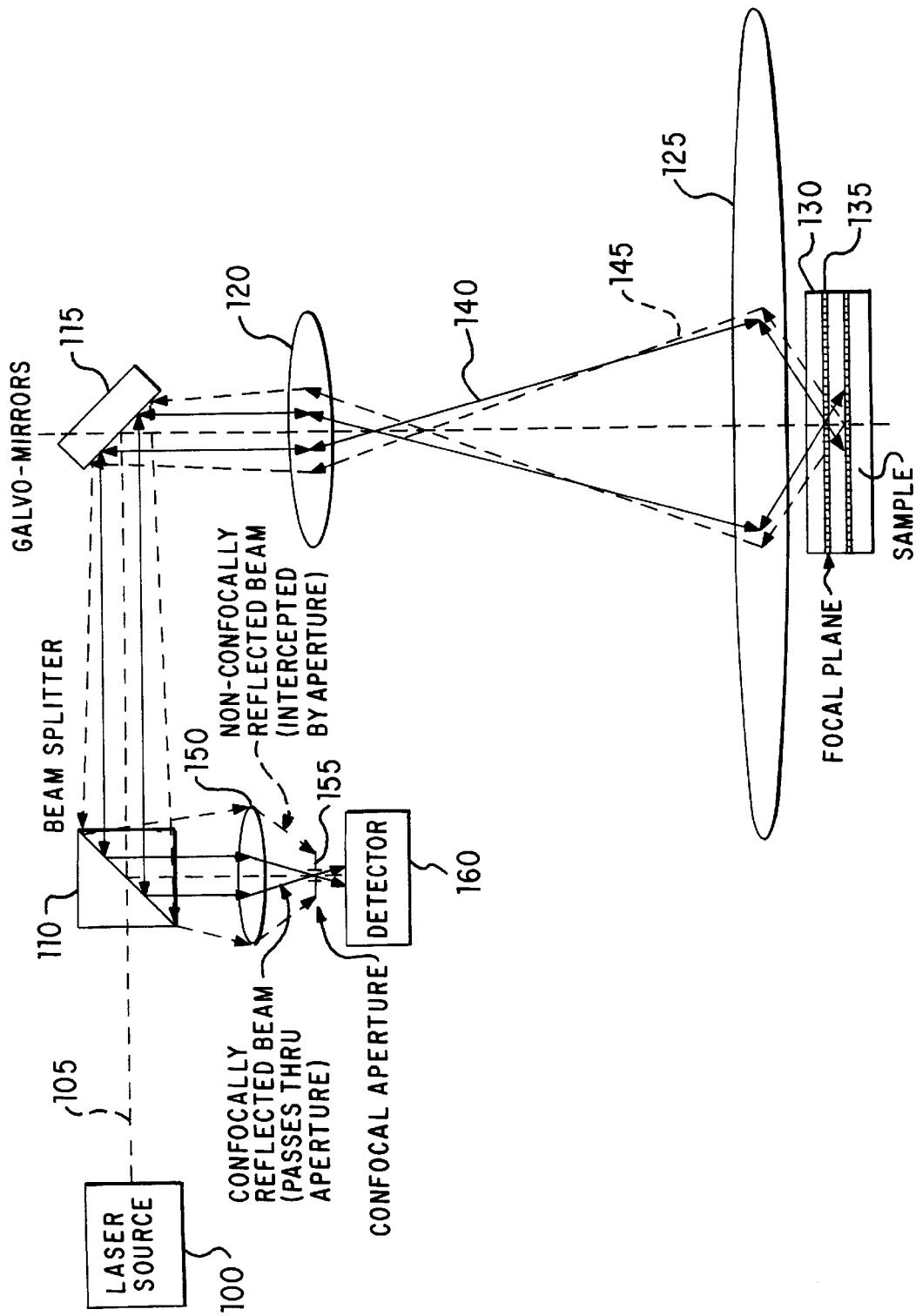
FIG. 1 illustrates schematically the principal of a confocal laser-beam probe system.
Figure 2:
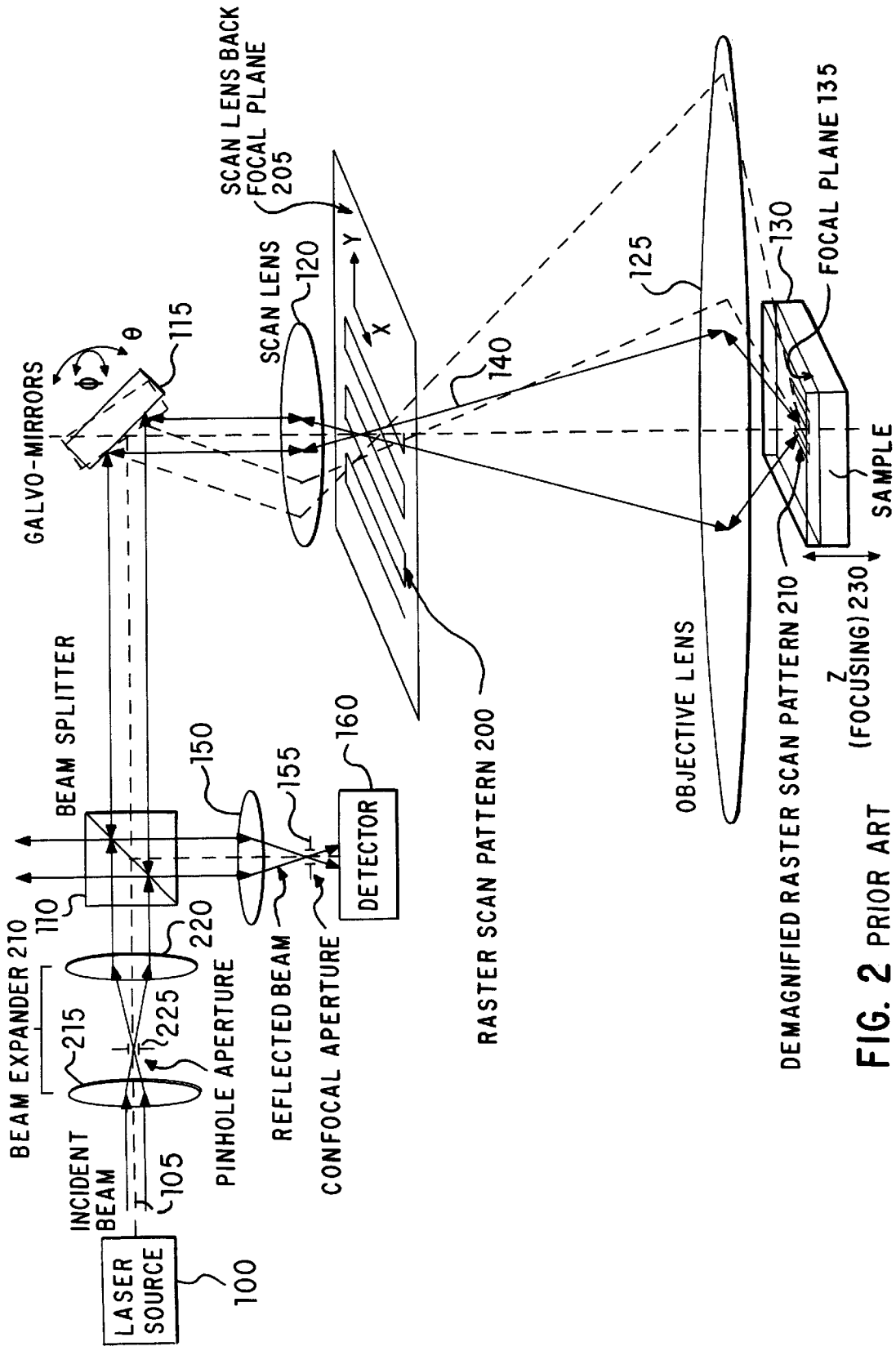
FIG. 2 illustrates schematically how a confocal laser-beam probe system is scanned in three dimensions to examine regions of interest within a sample.
Figure 3A:
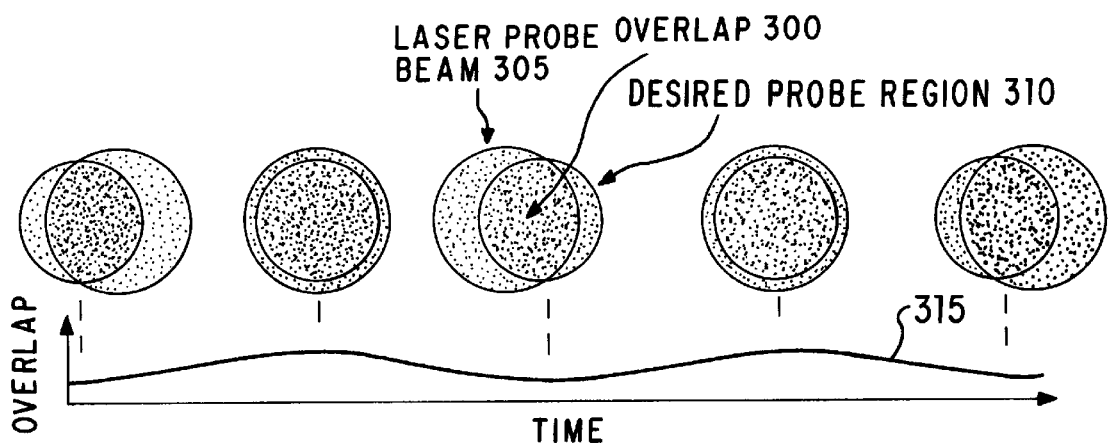
FIG. 3A illustrates how noise causes overlap between the laser probe beam and the desired probe region to vary.
Figure 3B:
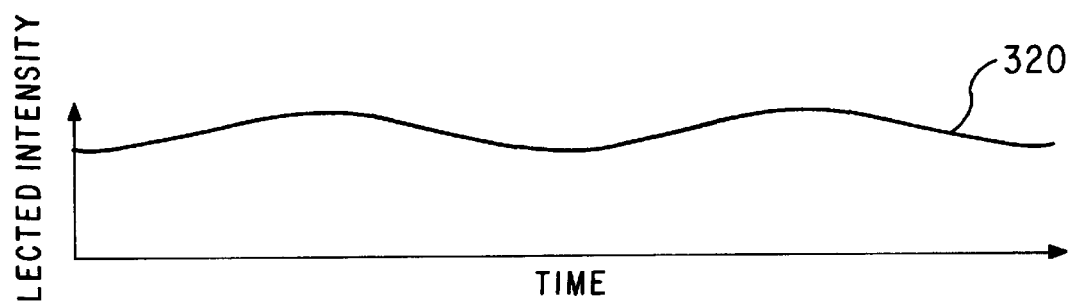
FIG. 3B illustrates how variation in overlap between the laser probe beam and the desired probe region results in noise in the detected intensity.
Figure 3C:
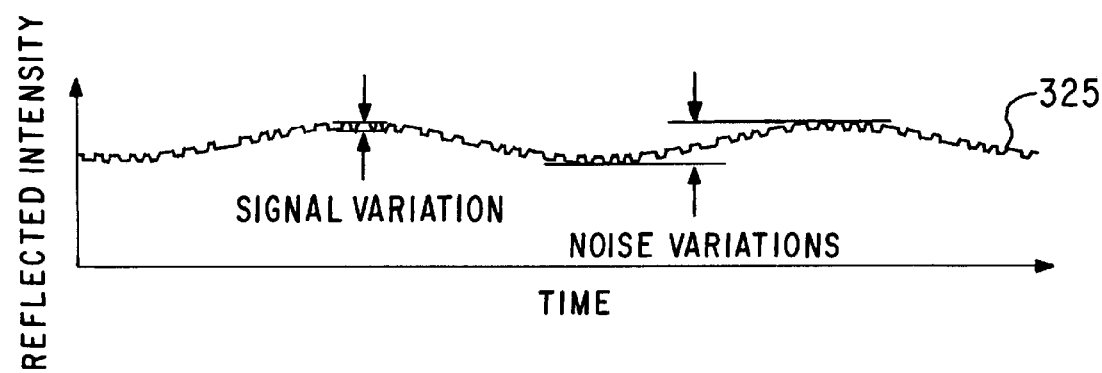
FIG. 3C illustrates how noise as in FIG. 3B may mask a signal of interest.

FIGS. 3A–3B show the noise effect of beam wobble. The present invention applies to the cancellation of such noise effects, and others such as laser noise (laser pulse-to-pulse amplitude variations) and temperature drift effects in electronic and optical systems.

A method according to the present invention comprises sampling a point on a DUT with a reference (continuous wave CW) laser and with a probe (mode locked ML) laser and monitoring the incident and reflected laser energy for each laser to derive the reflection coefficient of the DUT.

In the following description,

Ic=CW reference incident energy

Rc=CW reference reflected energy

Imn=ML probe incident energy at waveform sample position n

Rmn=ML probe reflected energy at waveform sample position n.

The reference pulse is always applied at a fixed time relative to the DUT waveform and the probe pulse is applied at different positions throughout the waveform. Typically, several measurements of the reference pulse and probe pulse will be taken for each position sampled in the waveform.

A trigger signal is applied for each waveform repetition on the DUT and a CW reference reflection coefficient Kc=Rc/Ic is found. This coefficient is independent of the actual CW pulse energy. Also, for example with the probe set to waveform sample position n, a ML probe reflection coefficient Ksn=Rmn/Imn is found. This coefficient is independent of the actual ML pulse energy. These ratios should be approximately equal to each other and will both vary as the reflectivity of the DUT changes due to noise such as beam wobble so that the ratio of the ratios is substantially constant.

A ratio can be defined for sample position n, Ksn=Kc/Kmn, which is independent of laser pulse energy and independent to a great degree of the position of the beam on the DUT. Similarly coefficients Ks(n+1), Ks(n+2), . . . etc. can be found for all other sample positions. The change of voltage or current in the DUT will slightly change the coefficient Ks, so that changes in Ks can be interpreted as changes in the state of the DUT and plotted against time to show a waveform.

Figure 6:
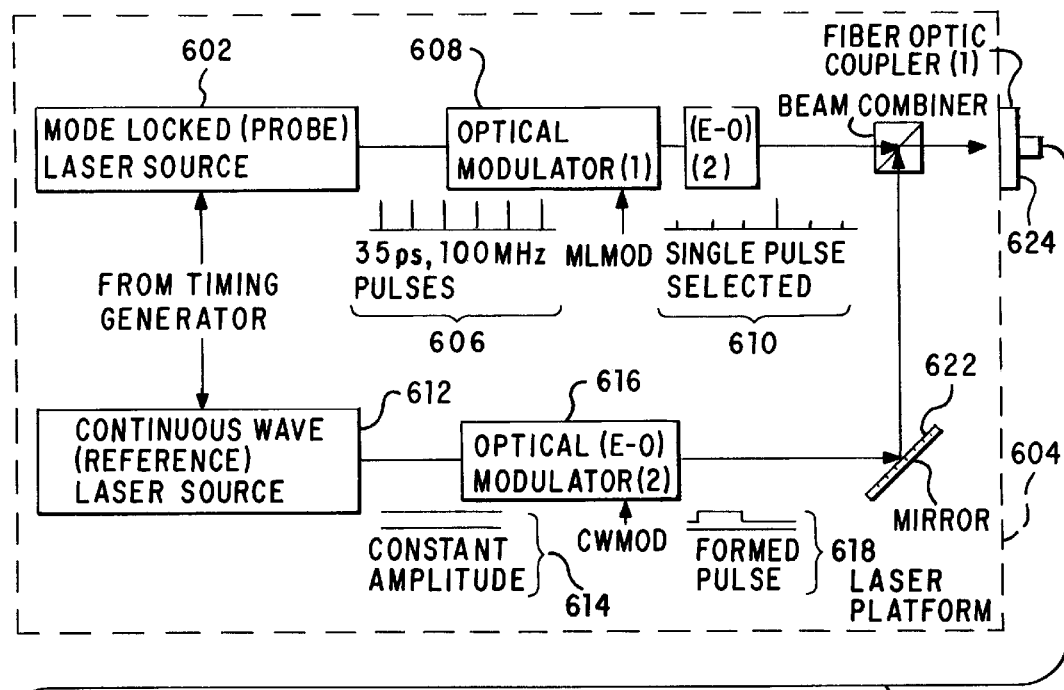
FIG. 6 is a schematic illustration of a dual-laser probe system in accordance with the invention.
Figure 6:
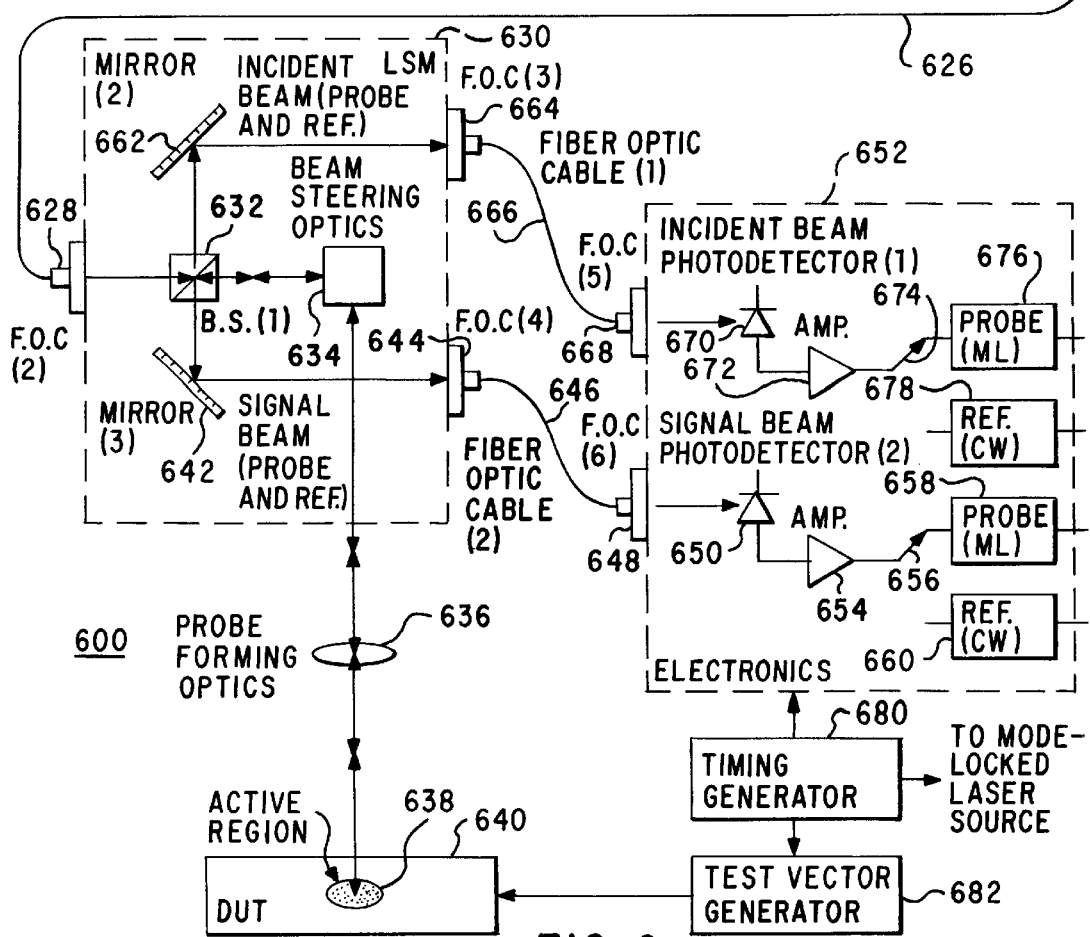

FIG. 6 schematically illustrates a system 600 which employs a noise cancellation scheme in accordance with the invention. A mode-locked laser source 602, such as a Lightwave model 131–200 laser source located on a laser platform 604, is used to form probe pulses 606. Source 602 emits pulses of short time duration, such as pulses of ~35 ps width, at a repetition rate of 100 MHz. These pulses pass through an optical modulator 608, such as a Conoptics 360-80 Electro-Optic Modulator, which selects a single pulse for probing during each cycle of a test pattern applied repetitively to a DUT, as indicated at 610. A reference-laser source 612 producing an output as indicated at 614, and a second optical modulator 616, both also located on laser platform 610, are used to form reference pulses 618. Reference-laser source 612 can be of the continuous wave (CW) variety, such as Santa Fe Laser Co. model MYLS-500, since extremely short pulses of duration in 10's of ps are not required for the reference beam. Optical modulator 616 blanks the CW laser to form pulses 618 at its output as short as ~10 ns duration. The pulses from optical modulator 608 and optical modulator 616 are guided to a beam combiner 620 such as a Newport model 10QM20LP.90/70 output coupler, using beam deflecting optics such as mirror 622 as necessary. After passing through beam combiner 624, the laser pulses are focused through a fiber-optic coupler 624 into a polarization-preserving single-mode optical fiber 626 where they are guided via a polarized fiber-optic coupler 628 to a laser scanning microscope (LSM) 630.

At LSM 630, the output from single-mode optical fiber 626 is recollimated. A portion is transmitted through a beam splitter 632 to beam steering optics 634. From beam steering optics 634, the beam is focused by probe-forming optics 636 onto a region, such as active region 638, of a DUT 640. The reflected beam retraces the path back to beam splitter 632 where a portion is reflected, guided by mirror 642 or the like as appropriate, and focused through a fiber-optic coupler 644 into a multi-mode fiber optic cable 646. The output end of cable 646 is coupled through a fiber-optical coupler 648 into a signal-beam photodetector 650 within a signal-detection-electronics subsystem 652. The output of signal-beam photodetector 650 is amplified in amplifier 654 and diverted by a fast switch 656 into the appropriate channel (mode-locked probe channel ML 658 or continuous-wave reference channel CW 660) for digitization and computer processing, e.g., to divide the reflected probe-laser intensity by the reflected reference-laser intensity.

A portion of the incident beam from fiber optic cable 626 is diverted by beam splitter 632, guided by mirror 662 or the like as appropriate, and passed via a fiber-optic coupler 664, multi-mode fiber optic cable 666 and fiber-optic coupler 668 to an incident-beam photodetector 670. The signal from incident-beam photodetector 670 is amplified in an amplifier 672 and diverted by a fast switch 674 into the appropriate channel (mode-locked probe channel ML 676 or continuous-wave reference channel CW 678) for digitization and computer processing, e.g., as a measure of the incident-laser pulse intensity. This measurement gives information about laser-intensity fluctuations, a form of noise not amenable to cancellation by the noise cancellation scheme disclosed here, and can be used for normalization of the incident-beam intensity.

Laser-probe system 600 operates under control of a timing generator subsystem 680 which communicates with mode-locked laser source 602, with electronics subsystem 652 and with a test vector generator 682 which applies a repetitive pattern of test vectors to DUT 640. Timing generator subsystem 680 and its relationship to test vector generator 682 and mode-locked laser source 602 are shown schematically in FIG. 7.

Test-vector generator 682 generates a repeating sequence (a loop) of N test vectors and applies these as a stimulus to the DUT on lines 700. Test-vector generator 682 also supplies a start-of-loop marker which is used to synchronize the operation of laser-voltage probe system 600 to the operation of the DUT. A probe-timing sequence generator, described below, controls timing (position within the test cycle) and width (duration) of reference and probe pulses within the test-vector loop as well as sequencing of reflected and incident light detection in the electronics subsystem.

A waveform on the DUT is acquired by collecting data from the incident and reflected light detectors as the reference pulse is maintained in a constant timing position (Tr) relative to the start-of-loop marker and the probe pulse is moved through a series of fixed timing positions relative to the start-of-loop marker, from T(start-of-sweep) to T(end-of-sweep). Typically, 500 different time positions are used, though the probe beam may remain at each time position for many thousands of test vector cycles to enable reduction in waveform noise through averaging or other processing of the collected data.

The output signal from a 100 MHz crystal oscillator 702 controls the mode locker of mode-locked laser source 602. The internal electronics of mode-locked laser source 602 divides this signal by two, producing a 50 MHz drive signal for the mode locker; mode-locked laser source 602 generates pulses at twice the mode-locker rate.

The output signal from oscillator 702 also clocks a programmable divide-by-Q divider 704, the output of which is in turn applied via an adjustable delay 706 to one input of a phase comparator 708. The output of a voltage-controlled oscillator (VCO) 710 is applied to a programmable divide-by-P divider 712, the output of which is applied to the other input of phase comparator 708. The output of phase comparator 708 is a voltage which controls the frequency of VCO 710. The frequency (F) of VCO 710 is controlled by this loop to be:

$$F = 100 \text{ MHZ} * P/Q$$

Test vector generator 682 uses VCO 710 as its vector-clock input. By adjustment of P and Q, the vector-clock frequency (F) can be set over a wide range.

Timing generator 682 is synchronized to the test loop by using a test vector as a marker which indicates the start of the loop to reset the divide-by-P counter 712. Also to maintain synchronism, the number N of vectors in the test loop is programmed to:

$$N = K * P \text{ where } K \text{ is any integer.}$$

The start-of-loop marker is also used to reset a reference-delay counter 714. Reference-delay counter 714 gives an output signal after M vector-clock pulses, M being chosen to place the reference pulse at a desired position in the vector sequence. The output signal from reference-delay counter 714 starts a timing-sequence generator 716 which controls operation of the reference-signal detection channels of electronics 652. Output signal CWMod from timing-sequence generator 716 is used to drive optical modulator 616 in the CW laser light path, thus producing the reference pulse. The other output signals of timing-sequence generator 716 are used by signal acquisition electronics 652 as described below.

Position of the probe pulse relative the vector sequence is determined by divide-by-Q counter 704, synchronizer 718, coarse probe-delay counter 720, and fine probe-delay 706, in the following manner. Fine probe delay 706 is continuously adjustable over a 10 ns range. As this delay is changed, the phase-locked loop forces a phase change of the VCO 710 relative to crystal oscillator 702 such that the start of the test loop is shifted relative to the crystal oscillator by 0–10 ns. The time relationship of the 100 MHz laser-pulse train relative to the test vector pattern is therefore changed.

Figure 7:
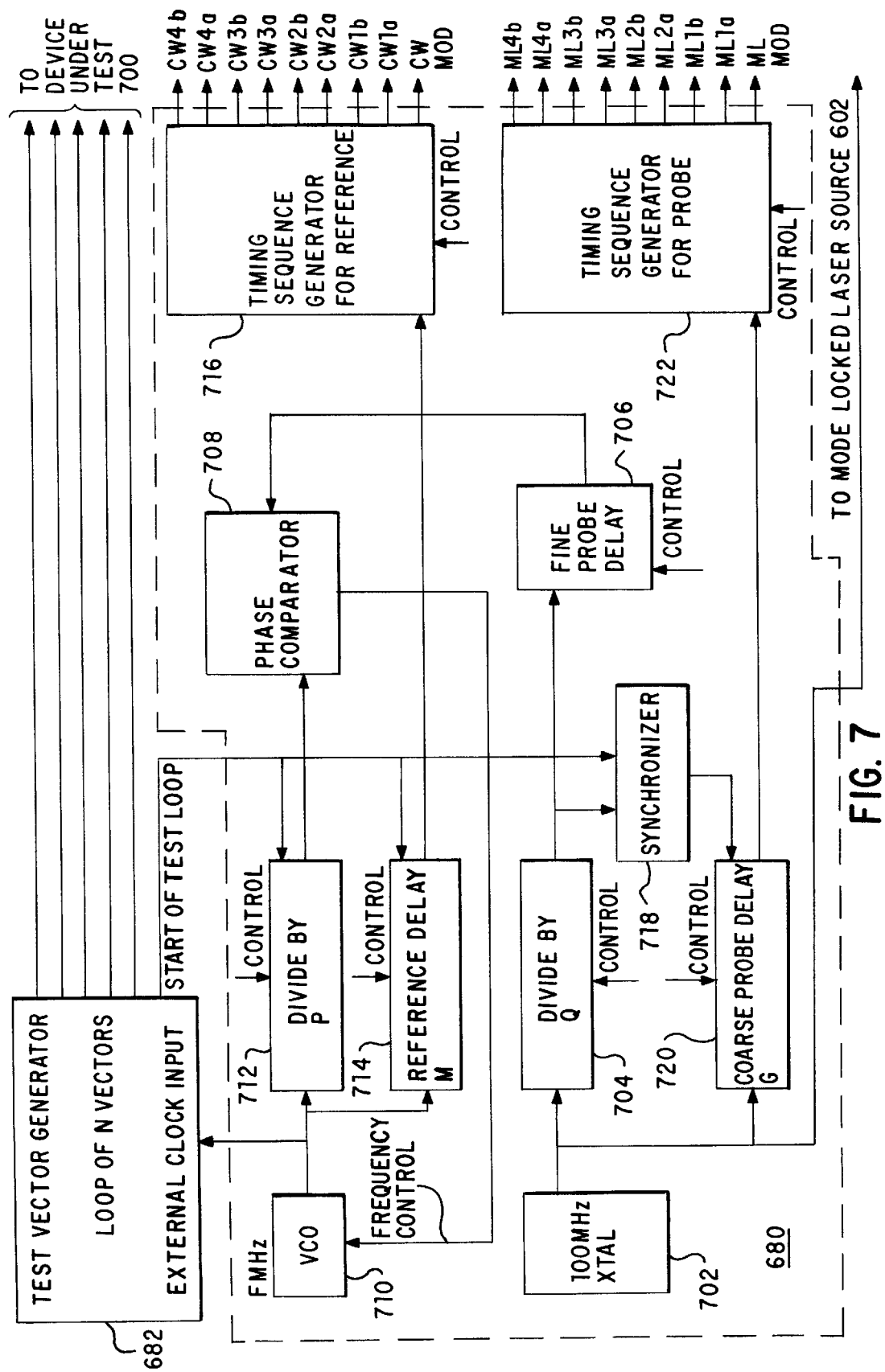
FIG. 7 is a schematic diagram of a timing generator useful in the system of FIG. 6.

Synchronizing device 718 receives as inputs the "start-of-test-loop" marker and the signal from divide-by-Q counter 704. Synchronizer 718 supplies a pulse to coarse-probe-delay counter 720 on the first output from divide-by-Q counter 704 after the start-of-test-loop marker. The pulse from synchronizer 718 is used to synchronously reset the coarse-probe-delay counter 720. Coarse-probe-delay counter 720 gives an output signal after G clock cycles of the crystal oscillator 702; this output signal starts a timing-sequence generator 722 which controls operation of the probe-signal detection channels of electronics 652. Output signal MLMod from timing-sequence generator 722 is used to drive optical modulator 608 in the mode-locked laser light path, so as to select from the pulse train one "probe" laser pulse for each repetition of the test-vector sequence applied to the DUT. The other output signals of timing-sequence generator 722 are used by signal acquisition electronics 652 as described below. As indicated in FIG. 7, elements of the timing generator subsystem 680 are preferably controllable via control signals, such as may be provided from a programmed general-purpose digital computer or other suitable source.

Figure 8:
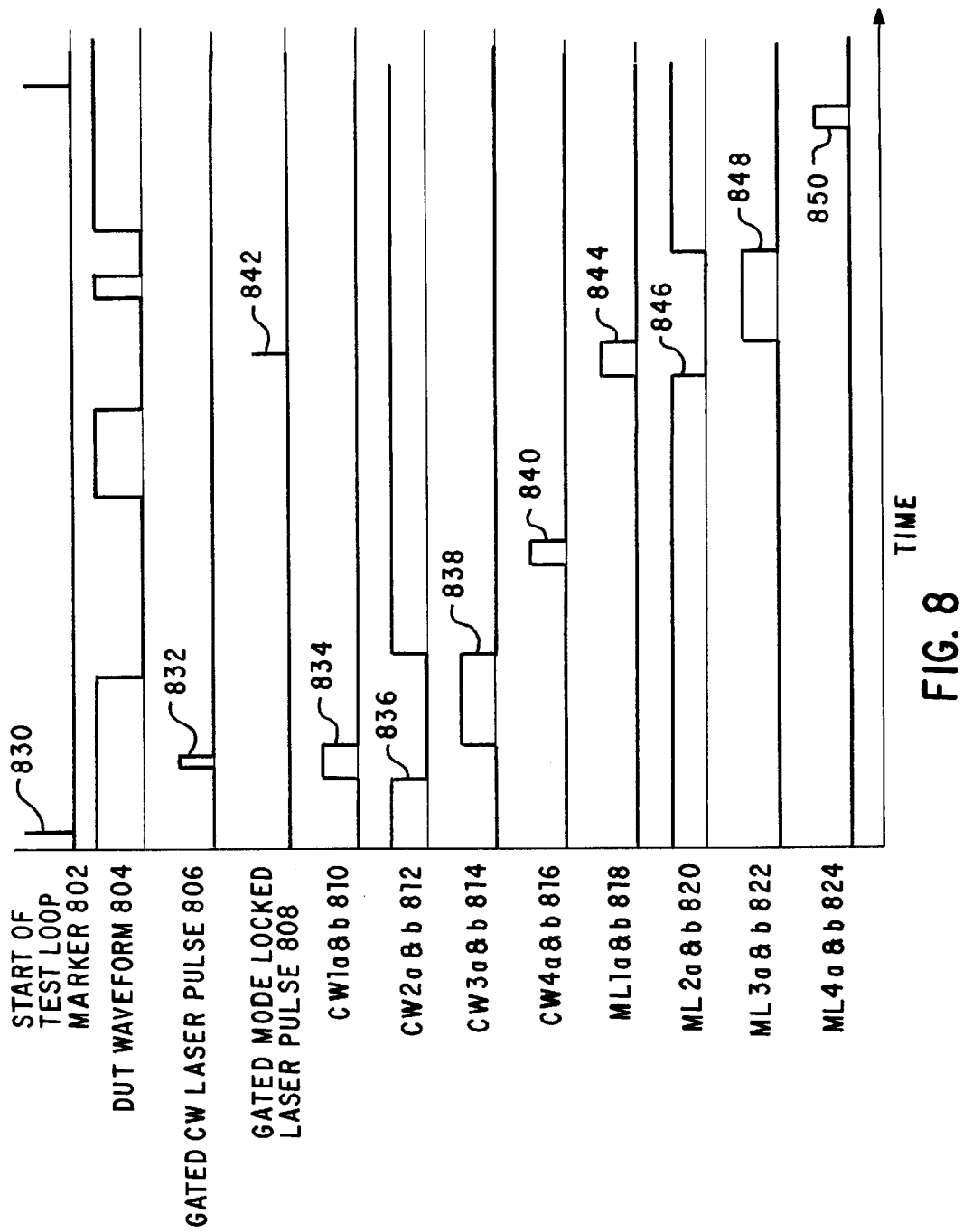
FIG. 8 shows timing relationships of signals in the timing generator of FIG. 7.

Timing sequence generators 716 and 722 produce a plurality of output signals which are shown in FIG. 8 in typical timing relationship relative to a start-of-loop marker 830 shown on line 802. As a test-vector sequence is applied to the DUT, a waveform such as shown on line 804 is produced on a conductor of the DUT. Signal CWMod from reference-timing sequence generator 716 enables a gated CW reference pulse 832 from optical modulator 616, as shown on line 806. When signal CWMod is produced, two pulse sequences are initiated: CW1$a$, CW2$a$, CW3$a$, CW4$a$, and CW1$b$, CW2$b$, CW3$b$, CW4$b$. Pulses CW1$a$ and CW1$b$ are shown at 834 on line 810, pulses CW2$a$ and CW2$b$ are shown at 836 on line 812, pulses CW3$a$ and CW3$b$ are shown at 838 on line 814, pulses CW4$a$ and CW4$b$ are shown at 840 on line 816. Signal MLMod from probe-timing sequence generator 722 enables optical modulator 608 to pass a probe pulse 842 as shown on line 808. When signal MLMod is produced, two pulse sequences are initiated: ML1$a$, ML2$a$, ML3$a$, ML4$a$, and ML1$b$, ML2$b$, ML3$b$, ML4$b$. Pulses ML1$a$ and ML1$b$ are shown at 844 on line 818, pulses CW2$a$ and CW2$b$ are shown at 846 on line 820, pulses CW3$a$ and CW3$b$ are shown at 848 on line 822, pulses CW4$a$ and CW4$b$ are shown at 850 on line 824.

The sequence of signals CW(1–4)$a$ is used to process the reflected CW (reference) light pulse. The sequence of signals CW(1–4)$b$ is used to process the incident CW light pulse. The two sequences are essentially identical but are generated separately so that propagation delay differences in the system are accounted for. Similarly, signal sequences ML(1–4)$a$ and ML(1–4)$b$ are used to process the reflected and incident mode-locked (probe) light pulse.

Figure 9:
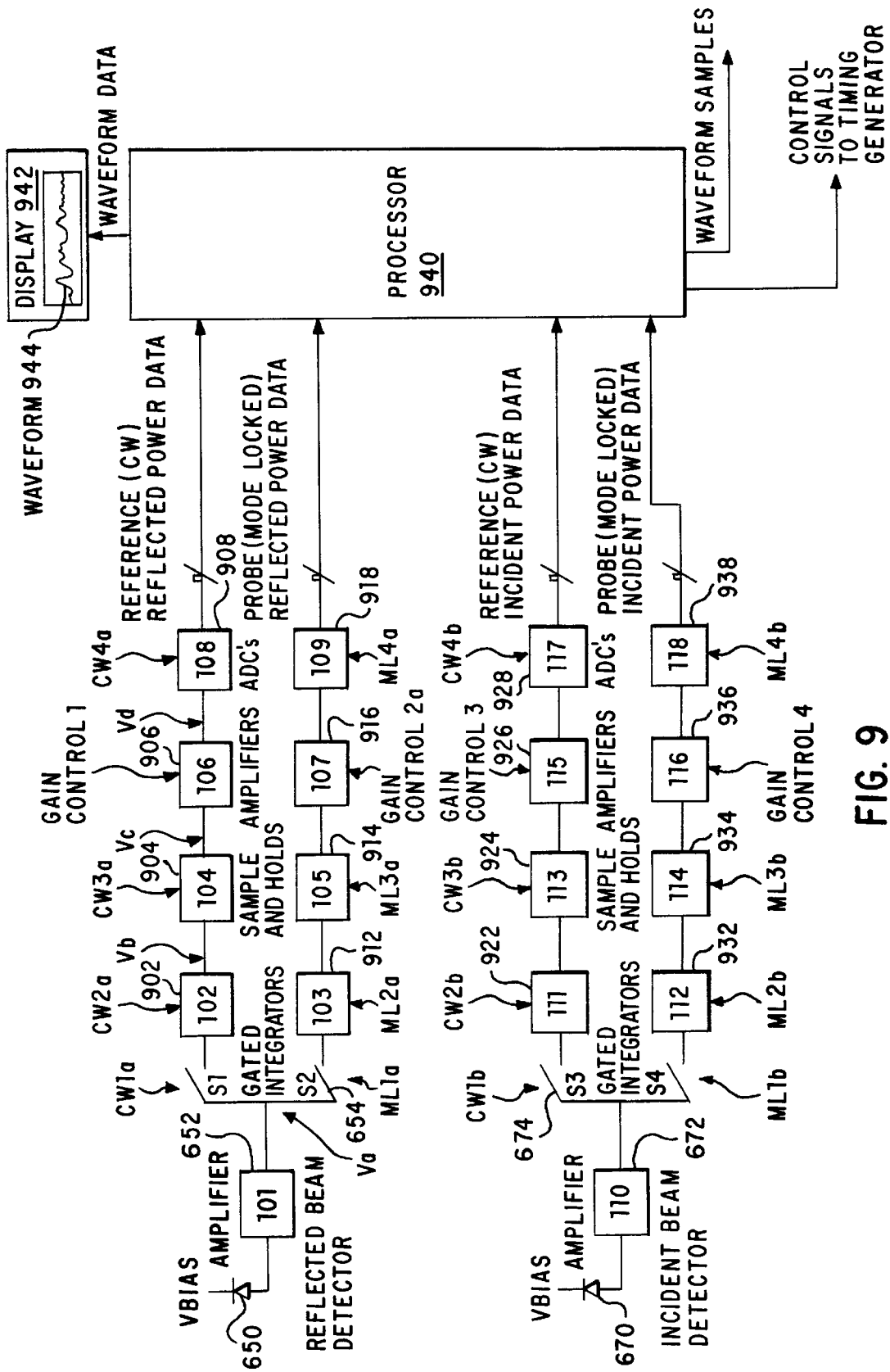
FIG. 9 is a schematic diagram of signal detection electronics useful in the system of FIG. 6.

FIG. 9 is a schematic diagram showing how signals from the timing generator are used by signal detection electronics 652 of the system of FIG. 6. There are two light-detecting diodes: photodetector 650 for the reflected light and photodetector 670 for the incident light. Current output from reflected-light detector diode 650 consists of two pulses separated in time, one from the reference light pulse and the other for the probe light pulse. These are amplified by amplifier 652, producing two voltage pulses on its output line. Control voltage CW1$a$, shown at 834, closes switch S1 for the time the reference pulse 832 appears at the amplifier output. Control voltage ML1$a$, shown at 844, closes switch S2 for the time the probe pulse 842 appears at the output. Switch S1 passes the reference pulse to an integrator 902. Until switch S1 closes, integrator 902 is held in a reset state by control voltage CW2$a$, shown at 836. When switch S1 closes, the reset is removed and integrator 902 integrates the voltage pulse from photodetector 650. The output of integrator 902 then remains constant, while sample and hold circuit 904 is switched from the hold state to the sample state when control voltage CW3$a$ goes from low to high, as shown at 838. The voltage on the output of integrator 902 is transferred to sample and hold circuit 904 during the period while control voltage CW3$a$ pulse 838 is high. Sample and hold circuit 904 returns to the hold condition when control voltage CW3$a$ goes low, and integrator 902 returns to its reset state when control voltage CW2$a$ goes high. The output of sample and hold circuit 904 consists of a series of voltage levels, each of which represents the total energy of a reflected reference light pulse. The output of sample and hold circuit 904 is amplified by a variable gain amplifier 906, and is then applied to the input of an analog-to-digital converter (ADC) 908. The gain of amplifier 906 is adjusted by a gain control signal to bring its output voltage into the range of ADC 908. Control voltage CW4$a$ controls the data conversion operation of ADC 908. Data at the output of ADC 908 represents the energy of the reflected reference light pulses (Rc).

Figure 10:
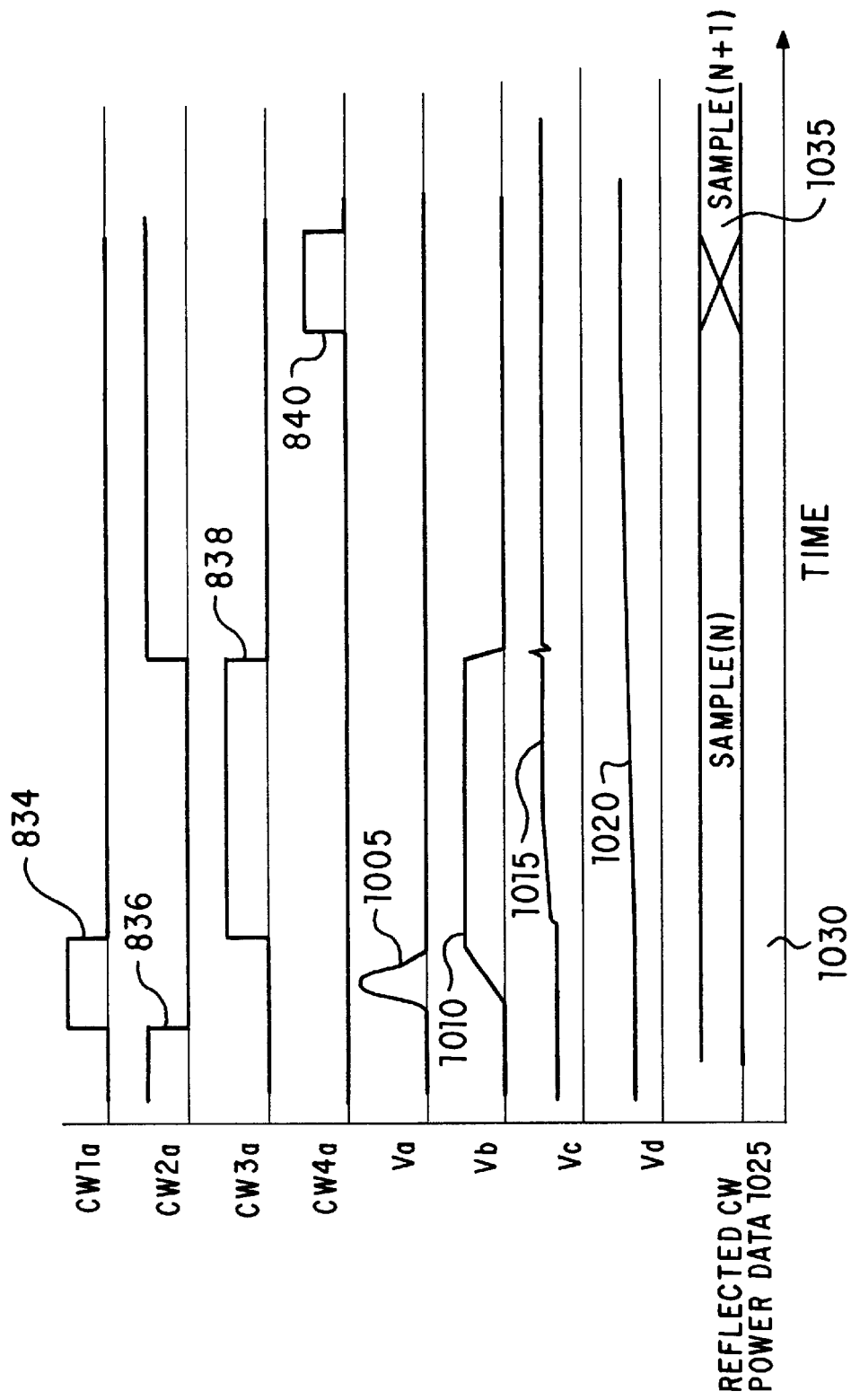
FIG. 10 shows timing relationships of signals in the signal detection electronics of FIG. 9.

FIG. 10 shows in expanded time scale typical voltage waveforms in this channel relative to control signals CW1*a*, CW2*a*, CW3*a* and CW4*a*. Voltage Va, appearing at the output of amplifier 652, contains the gated CW laser pulse 1005 during the time that pulse 834 of control voltage CW1*a* is high and switch S1 is closed. Voltage Vb, appearing at the output of gated integrator 902, goes up as shown at 1010 as pulse 1005 is integrated. Voltage Vc, appearing at the output of sample and hold circuit 904, has a level 1015 representing the total energy of pulse 1005. Voltage Vd, appearing at the output of variable-gain amplifier 906, has a level 1020 also representing the total energy of pulse 1005. The reflected CW power data, shown schematically at line 1025, has a block of data 1030 which comprises a sample N of voltage on a conductor of the DUT, a block of data 1035 comprising a sample N+1 of voltage on the same conductor of the DUT, and so on.

When control voltage ML1*a* goes high, as at 844, switch S2 is closed for the time the probe pulse 842 appears at the output of photodiode 650 and amplifier 652. Switch S2 passes the probe pulse to an integrator 912. Until switch S2 closes, integrator 912 is held in a reset state by control voltage ML2*a*, shown at 846. When switch S2 closes, the reset is removed and integrator 912 integrates the voltage pulse from photodetector 650. The output of integrator 912 then remains constant, while sample and hold circuit 914 is switched from the hold state to the sample state when control voltage ML3*a* goes from low to high, as shown at 848. The voltage on the output of integrator 912 is transferred to sample and hold circuit 914 during the period while control voltage ML3*a* pulse 848 is high. Sample and hold circuit 914 returns to the hold condition when control voltage ML3*a* goes low, and integrator 912 returns to its reset state when control voltage ML2*a* goes high. The output of sample and hold circuit 914 consists of a series of voltage levels, each of which represents the total energy of a reflected reference light pulse. The output of sample and hold circuit 914 is amplified by a variable gain amplifier 916, and is then applied to the input of an analog-to-digital converter (ADC) 918. The gain of amplifier 916 is adjusted by a gain control signal to bring its output voltage into the range of ADC 918. Control voltage ML4*a* controls the data conversion operation of ADC 918. Data at the output of ADC 918 represents the energy of the reflected probe light pulses (Rmn).

Similarly, current output from incident-light detector diode 670 consists of two pulses separated in time, one from the reference light pulse and the other for the probe light pulse. These are amplified by amplifier 672, producing two voltage pulses on its output line. Control voltage CW1*b*, shown at 834, closes switch S3 for the time the incident-light reference pulse 832 appears at the amplifier output. Control voltage ML1*b*, shown at 844, closes switch S4 for the time the probe pulse 842 appears at the output. Switch S3 passes the reference pulse to an integrator 922. Until switch S3 closes, integrator 922 is held in a reset state by control voltage CW2*b*, shown at 836. When switch S3 closes, the reset is removed and integrator 922 integrates the voltage pulse from photodetector 670. The output of integrator 922 then remains constant, while sample and hold circuit 924 is switched from the hold state to the sample state when control voltage CW3*b* goes from low to high, as shown at 838. The voltage on the output of integrator 922 is transferred to sample and hold circuit 924 during the period while control voltage CW3*b* pulse 838 is high. Sample and hold circuit 924 returns to the hold condition when control voltage CW3*b* goes low, and integrator 922 returns to its reset state when control voltage CW2*b* goes high. The output of sample and hold circuit 924 consists of a series of voltage levels, each of which represents the total energy of an incident reference light pulse. The output of sample and hold circuit 924 is amplified by a variable gain amplifier 926, and is then applied to the input of an analog-to-digital converter (ADC) 928. The gain of amplifier 926 is adjusted by a gain control signal to bring its output voltage into the range of ADC 928. Control voltage CW4*b* controls the data conversion operation of ADC 928. Data at the output of ADC 928 represents the energy of the incident reference light pulses (Ic).

When control voltage ML1*b* goes high, as at 844, switch S4 is closed for the time the probe pulse 842 appears at the output of photodiode 670 and amplifier 672. Switch S4 passes the incident probe pulse to an integrator 932. Until switch S4 closes, integrator 932 is held in a reset state by control voltage ML2*b*, shown at 846. When switch S4 closes, the reset is removed and integrator 932 integrates the voltage pulse from photodetector 670. The output of integrator 932 then remains constant, while sample and hold circuit 834 is switched from the hold state to the sample state when control voltage ML3*b* goes from low to high, as shown at 848. The voltage on the output of integrator 932 is transferred to sample and hold circuit 934 during the period while control voltage ML3*b* pulse 848 is high. Sample and hold circuit 934 returns to the hold condition when control voltage ML3*b* goes low, and integrator 932 returns to its reset state when control voltage ML2*b* goes high. The output of sample and hold circuit 934 consists of a series of voltage levels, each of which represents the total energy of an incident reference light pulse. The output of sample and hold circuit 934 is amplified by a variable gain amplifier 936, and is then applied to the input of an analog-to-digital converter (ADC) 938. The gain of amplifier 936 is adjusted by a gain control signal to bring its output voltage into the range of ADC 938. Control voltage ML4*b* controls the data conversion operation of ADC 938. Data at the output of ADC 938 represents the energy of the incident probe light pulses (Imn).

The ADC data outputs Rc, Rmn, Ic, Imn, are fed to a high-speed data acquisition board in a computer system which processes the data in the manner described below in relation to FIGS. 12 and 13. The computer system also performs system control activities not otherwise related to the present invention.

Figure 11:
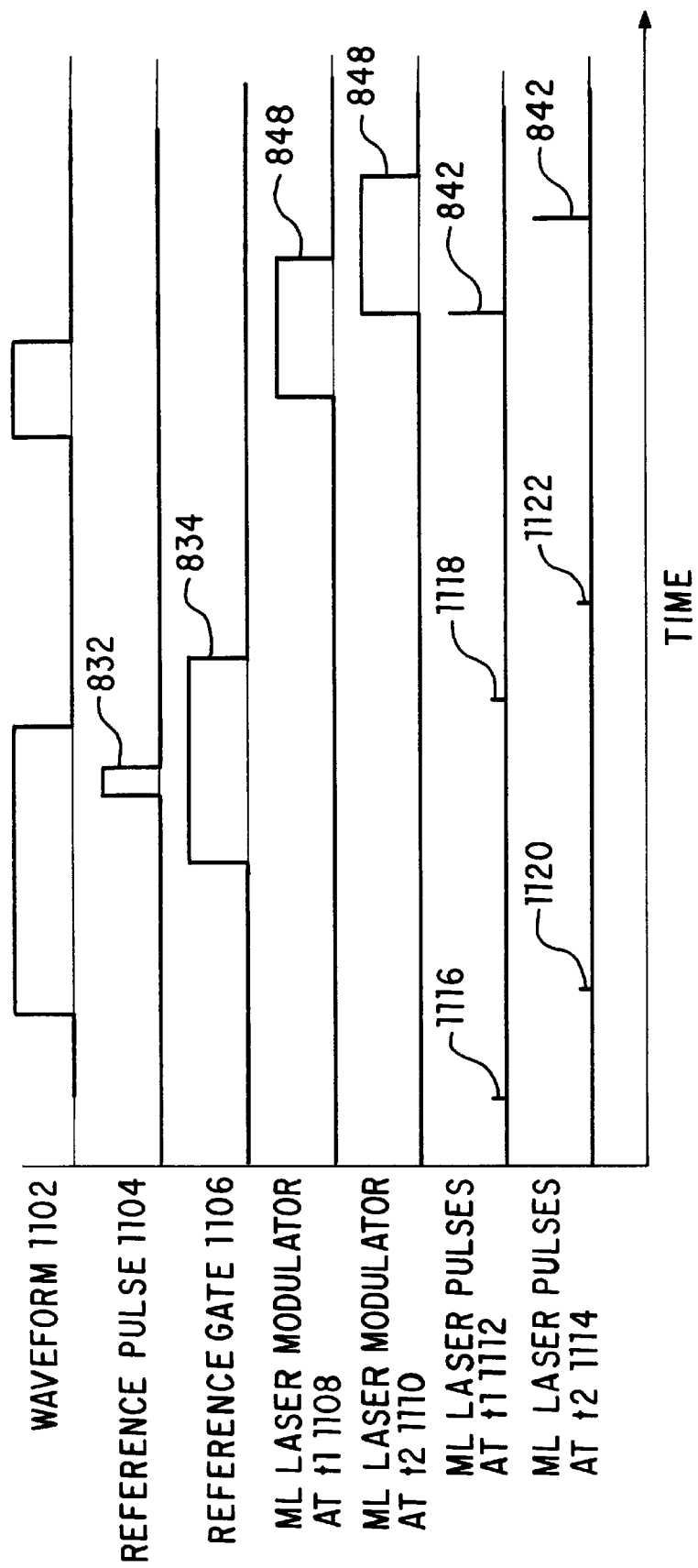
FIG. 11 illustrates the effect of reference detection errors due to vestigial mode-locked laser pulses.

FIG. 11 illustrates the effect of reference detection errors due to vestigial mode-locked laser pulses. The reference pulse, shown in expanded time scale at line 1104, is at a fixed time position relative to the DUT waveform, shown at line 1102. As described above, the reference pulse detector channel integrates the output of a photodetector during the reference gate time defined by reference gate pulse 834. During waveform acquisition the probe light pulse 842 from the mode-locked laser is made to take a range of positions relative to the waveform. This is done by (a) phase shifting the mode-locked laser relative to the DUT waveform as described above with reference to FIG. 7, and (b) using optical modulator 608 to select one pulse from the mode-locked laser pulse train for each repetition of the test-vector pattern applied to the DUT. Line 1108 of FIG. 11 shows probe gate pulse 848 positioned with a first time shift t1 relative to DUT waveform 1102 during one repetition of the test-vector pattern; line 1110 shows probe gate pulse 848 positioned with a different time shift t2 relative to DUT waveform 1102.

Optical modulator 608 does not block the unwanted mode-locked-laser pulses completely but only attenuates them by a factor of about 500 to 1000 (for one modulator crystal) and up to 100,000 (for two modulator crystals in series). Vestigial mode-locked-laser pulses, such as shown at 1116, 1118, 1120 and 1122, remain. Those vestigial mode-locked-laser pulses occurring in the reference gate time defined by pulse 834, such as vestigial pulse 1118 in line 1112, will be included as part of the reference-pulse energy measurement. No vestigial mode-locked-laser pulse falls within the reference gate time when the mode-locked laser is shifted relative to the test-vector pattern as in line 1114. The number of such vestigial mode-locked-laser pulses included will in general vary with the laser phase, and will only be constant if the reference gate time is exactly a multiple of the mode-locked-laser repetition rate.

Figure 12:
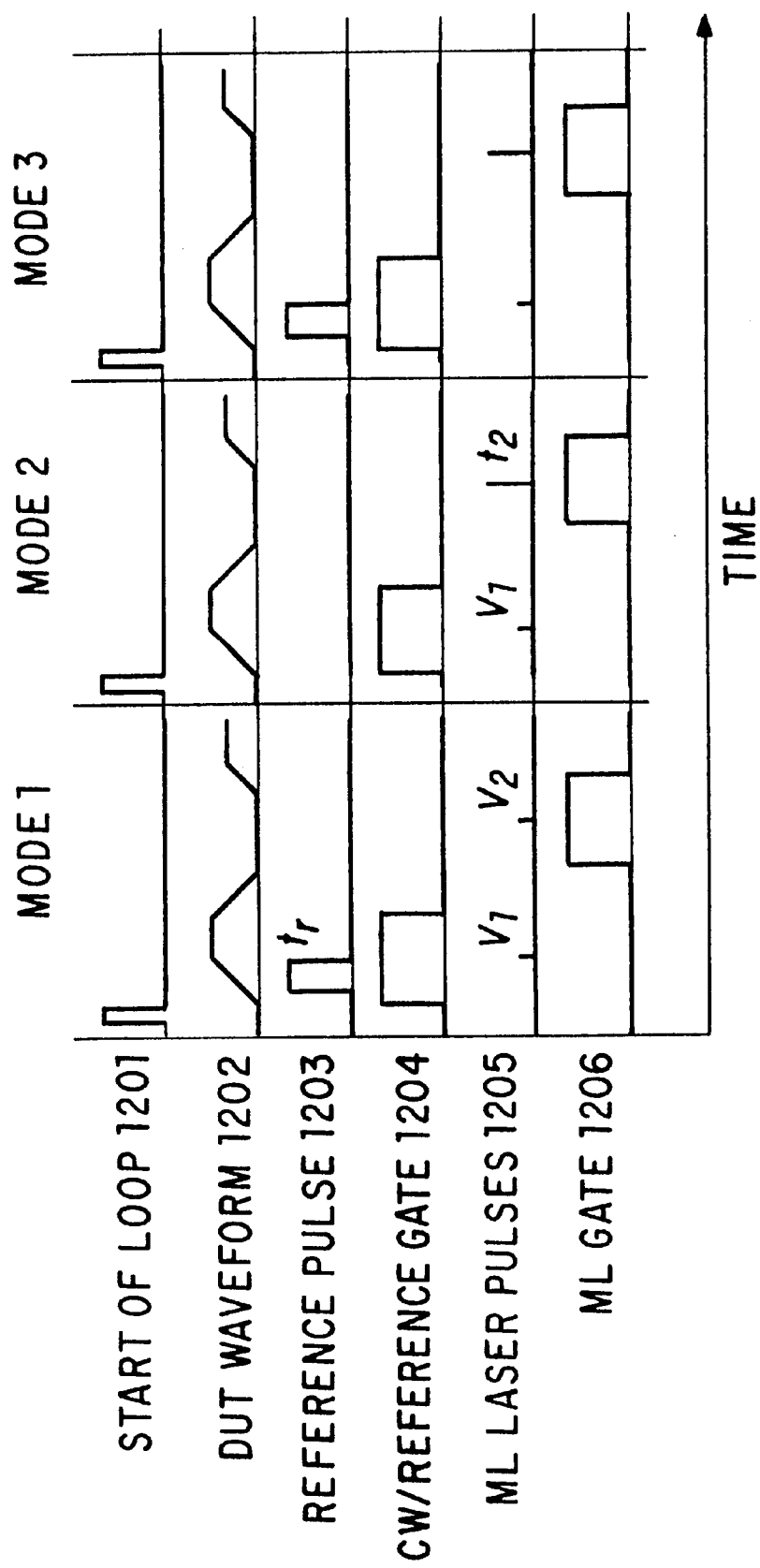
FIG. 12 illustrates correction for vestigial mode-lock laser pulses by using different measurement modes in accordance with the invention.
Figure 13:
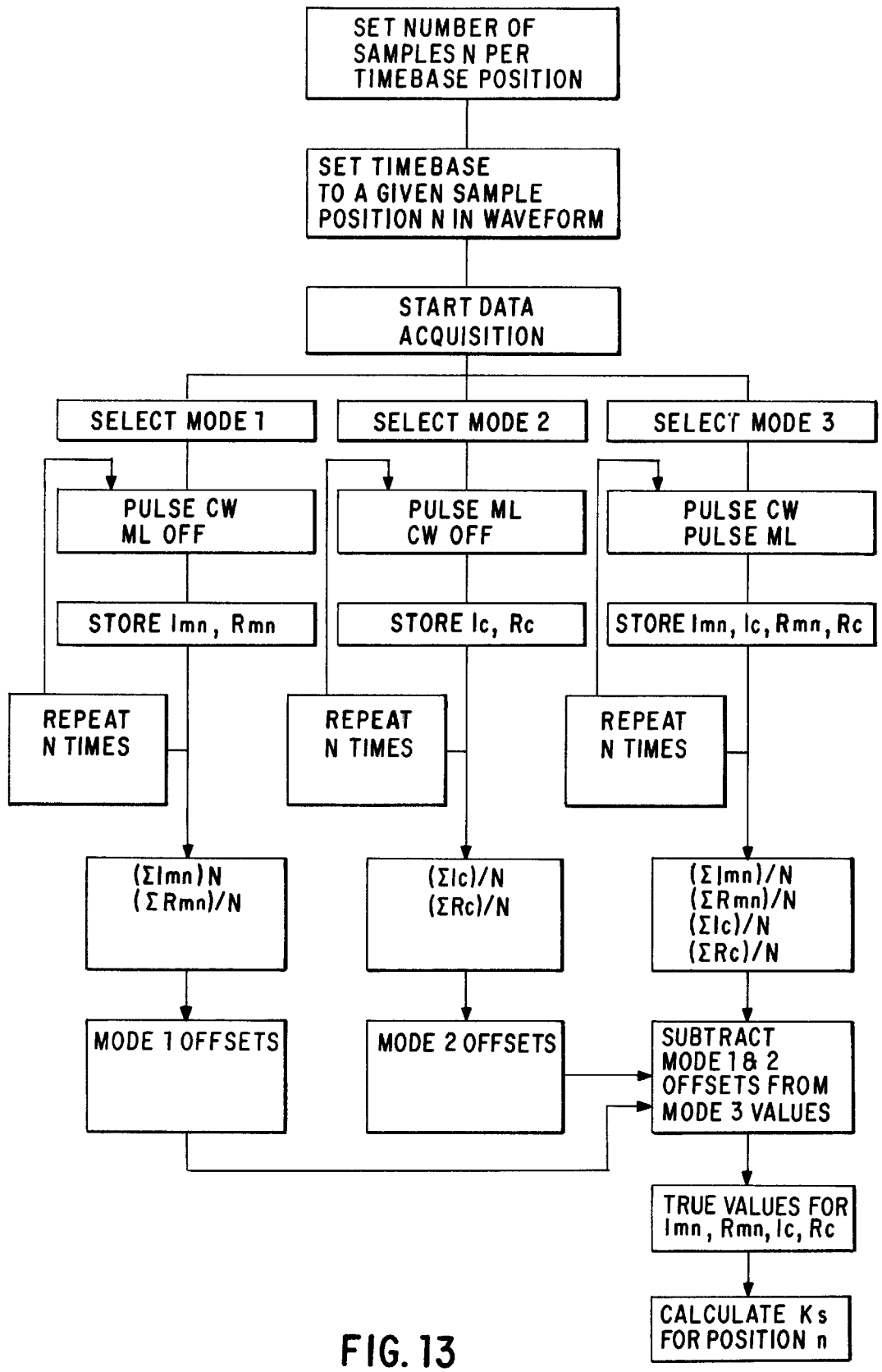
FIG. 13 is a flow chart showing the steps in the correction method of FIG. 12.

In order to correct for the inaccuracies introduced by the presence of vestigial mode-locked laser pulses, a three mode measurement is adopted for each sample position in a waveform as is shown in FIG. 12. This scheme assumes a repeating DUT waveform 1202, a trigger signal occurring at the start of each repetition 1201, a reference CW pulse 1203 and corresponding measurement gate 1204, and a ML probe pulse 1205 and corresponding measurement gate 1206. In Mode 1, the CW laser is pulsed at time $t_r$ and the ML probe modulator is always off (leaving only vestigial pulses $v_1$ and $v_2$). The resulting small signal detected in the incident and reflected ML channels during the ML gate period is stored as an offset. This mode will be repeated for a number of repetitions of the waveform, typically in the range of 10's–1000's depending on system performance. The system then moves to Mode 2 in which the ML probe laser is pulsed ($t_2$) but the CW reference laser is always off. The resulting small signal detected in the incident and reflected CW channels due to the vestigial pulse $v_1$ is stored as an offset. This mode is repeated as for Mode 1. The system then moves to Mode 3 in which both CW reference and ML probe lasers are pulsed and the incident and reflected signals for both channels stored. These three modes provide sufficient information to correct for such inaccuracies as will be described below.

The ADC's continually provide data to the acquisition board in the computer system. The selection of which data is taken, i.e. which mode is selected is under the control of the computer system which operates in the following manner as summarized in the flow chart of FIG. 13. The operator sets the number of samples N per timebase position in the waveform. This can be in the range of 10's to 1000's depending on specific system and device details. The operator then sets the system to sample a specific position n in the waveform and starts data acquisition. First Mode 1 is selected and the computer system operates to control the CW and ML lasers such that the CW is pulsed and the ML is off, and stores only Imn and Rmn. This is repeated N times and true averages of Imn and Rmn calculated. These are stored as Mode 1 offsets. Mode 2 is then selected and the computer system operates to control the CW and ML lasers such that the CW is off and the ML is pulsed, and stores only Ic and Rc. This is repeated N times and true averages of Ic and Rc calculated. These are stored as Mode 2 offsets. Mode 3 is then selected and the computer system operates to control the CW and ML lasers such that both are pulsed and Imn, Rmn, Ic and Rc are stored. This is repeated N times and true averages of Imn, Rmn, Ic and Rc are calculated. The Mode 1 and 2 offsets are subtracted to derive the true values and Ksn is calculated in the manner described above. The value Ksn can then be stored or output to a display as the waveform value at position n. Thus by obtaining Ksn for all positions in the waveform, the full waveform can be determined. This can be done by the computer system or the data can be stored in the computer system but accessed by a workstation which can also be used to input control information to the computer system and display images obtained by the dual-laser probe system.

Those of skill in the art will recognize that these and other modifications can be made within the spirit and scope of the invention as defined in the claims which follow.

We claim:

1. A method of probing an integrated circuit device with laser light to acquire samples of a waveform appearing on the device as the device is exercised by a repetitive pattern of test vectors, comprising:
   a. applying a probe-laser pulse 832 to a region of the device at a selected time during each repetition of the pattern of test vectors and detecting energy reflected from the region as the probe-laser pulse is applied, to thereby produce a reflected-light probe sample;
   b. applying a reference-laser pulse 842 to said region of the device at a time during each repetition of the pattern of test vectors which is displaced relative to the time at which the probe-laser pulse is applied, and detecting energy reflected from the region as the reference-laser pulse is applied, to thereby produce a reflected-light reference sample;
   c. preparing a ratio of the reflected-light probe sample and the reflected-light reference sample for each repetition of the pattern of test vectors to produce a waveform sample having improved signal-to-noise relative to the reflected-light probe sample.

2. The method of claim 1, wherein the selected time of the probe-laser pulse 832 is offset relative to the reference-laser pulse 842 within each repetition of the pattern of test vectors, and wherein a waveform samples are produced at a plurality of selected times within the pattern of test vectors to reconstruct the waveform by equivalent time sampling.

3. The method of claim 1, wherein detecting the energy reflected from said region as the laser-probe pulse is applied and the energy reflected from said region as the reference-laser pulse is applied comprises detecting energy reflected from said region to produce a detector signal, applying the detector signal to a probe-signal integrator 912 during a probe-gate period 844 when the probe-laser pulse is applied to said region, and applying the detector signal to a reference-signal integrator 902 during a reference-gate period 834 when the reference-laser pulse is applied to said region.

4. The method of claim 1, wherein applying the probe-laser pulse 842 to said region comprises generating a train of pulses 606 from a mode-locked laser source 602, selecting the probe-laser pulse from said train of pulses, and applying the selected pulse to said region.

5. The method of claim 4, wherein applying the reference-laser pulse 832 to said region comprises generating a laser beam from a reference source 612, gating the laser beam to produce the reference-laser pulse, and applying the reference-laser pulse to said region.

6. The method of claim 1, wherein detecting energy reflected from said region as the probe-laser pulse is applied comprises producing a detector signal by detecting energy reflected from said region as the probe-laser pulse is applied, producing an integrator signal by integrating the detector signal during a probe-signal gate period 846, producing a sample signal by sampling the integrator signal, and producing the reflected-light probe sample by digitizing the sample signal.

7. The method of claim 1, wherein detecting energy reflected from said region as the reference-laser pulse is applied comprises producing a detector signal (Va) by detecting energy reflected from said region as the reference-laser pulse is applied, producing a reference integrator signal (Vb) by integrating the detector signal during a reference-signal gate period 836, producing a sample signal (Vc) by sampling the reference integrator signal, and producing the reflected-light reference sample by digitizing the sample signal.

8. The method of claim 1, wherein applying the probe-laser pulse 842 to said region comprises adjusting phase relationship of the pattern of test vectors relative to a train of pulses from a mode-locked-laser source, selecting a pulse from said train of pulses, and applying the selected pulse to said region of the device.

9. The method of claim 1, wherein applying the probe-laser pulse 842 to said region comprises: generating a clock signal, synchronizing operation of a mode-locked-laser source 602 to the clock signal, generating a train of pulses 606 from the mode-locked laser source 602, deriving from the clock signal an adjustable test-vector clock, applying the adjustable test-vector clock to a test-vector generator 682 to produce the pattern of test vectors in a selected phase relationship to the train of pulses 606, selecting the probe-laser pulse from the train of pulses, and applying the selected pulse to said region.

10. The method of claim 1, further comprising the step of compensating for variations in incident power level of the probe-laser pulse and of the reference-laser pulse.

11. The method of claim 10, wherein compensating for variations in incident power level comprises: detecting incident-energy level of the probe-laser pulse, detecting incident-energy level of the reference-laser pulse, using the detected incident-energy level of the probe-laser pulse to normalize intensity of a probe-laser-pulse source, and using the detected incident-energy level of the reference-laser pulse to normalize intensity of a reference-laser-pulse source.

12. The method of claim 4, wherein selecting the probe-laser pulse from said train of pulses comprises suppressing unwanted pulses from the train of pulses in an optical modulator.

13. The method of claim 12, wherein suppressing the unwanted pulses comprises passing vestigial pulses, further comprising the steps of: detecting energy of any vestigial pulses $v_1$ occurring during a reference-gate interval 1204 as a reference-signal offset and using the reference-signal offset to compensate the reflected-light reference sample; and detecting energy of any vestigial pulses $v_2$ occurring during a probe-gate interval 1206 as a probe-signal offset and using the probe-signal offset to compensate the reflected-light probe sample.

14. The method of claim 8, wherein selecting a pulse from said train of pulses comprises suppressing unwanted pulses from the train of pulses in an optical modulator.

15. The method of claim 14, wherein suppressing the unwanted pulses comprises passing vestigial pulses, and wherein detecting energy reflected from the region as the reference-laser pulse is applied comprises detecting energy from the region during a time reference-gate interval 834 which includes a selected number of said vestigial pulses.

16. Apparatus for probing an integrated circuit device with laser light to acquire samples of a waveform appearing on the device as the device is exercised by a repetitive pattern of test vectors, comprising:

a. a laser-optical system 604, 630 for applying a probe-laser pulse 832 to a region of the device at a selected time during each repetition of the pattern of test vectors and for applying a reference-laser pulse 842 to said region of the device at a time during each repetition of the pattern of test vectors which is displaced relative to the time at which the probe-laser pulse is applied;

b. a reflected-power detection system 630, 652 for detecting energy reflected from the region as the probe-laser pulse is applied, to thereby produce a reflected-light probe sample, and for detecting energy reflected from the region as the reference-laser pulse is applied, to thereby produce a reflected-light reference sample;

c. a processor for preparing a ratio of the reflected-light probe sample and the reflected-light reference sample for each repetition of the pattern of test vectors to produce a waveform sample having improved signal-to-noise relative to the reflected-light probe sample.

17. The apparatus of claim 16, wherein the selected time of the probe-laser pulse 832 is offset relative to the reference-laser pulse 842 within each repetition of the pattern of test vectors, and wherein a waveform samples are produced at a plurality of selected times within the pattern of test vectors to reconstruct the waveform by equivalent time sampling.

18. The apparatus of claim 16, wherein the reflected-power detection system comprises a reflected-light detector 650 responsive to energy reflected from said region to produce a reflected-light detector signal, a probe-signal integrator 912 for integrating the reflected-light detector signal during a probe-gate period 844 when the probe-laser pulse is applied to said region, and a reference-signal integrator 902 for integrating the reflected-light detector signal during a reference-gate period 834 when the reference-laser pulse is applied to said region.

19. The apparatus of claim 18, wherein the probe-signal integrator 912 produces an integrator signal and wherein the reflected-power detection system further comprises a sample-and-hold circuit 916 for sampling the integrator to produce a sample signal, and an analog-to digital converter 918 for digitizing the sample signal to produce the reflected-light probe sample.

20. The apparatus of claim 16, wherein the laser-optical system comprises a mode-locked-laser source 602 for generating a train of pulses 606, and an optical modulator 608 for selecting the probe-laser pulse from the train of pulses.

21. The apparatus of claim 19, wherein the laser-optical system further comprises a reference source 612 for generating a laser beam 614, and an optical modulator 616 for gating the laser beam to produce the reference-laser pulse.

22. The apparatus of claim 20, wherein the laser-optical system further comprises a beam combiner 620 and optical-transmission elements 624, 626, 628 634, 636 for applying the probe-laser pulse and the reference-laser pulse to said region.

23. The apparatus of claim 16, wherein the reflected-power detection system comprises a detector 650 for detecting energy reflected from said region as the reference-laser pulse is applied to produce a detector signal (Va), an integrator 902 for integrating the detector signal during a reference-signal gate period 836 to produce a reference-integrator signal (Vb), a sample-and-hold circuit 904 for sampling the reference-integrator signal to produce a sample signal (Vc), and an analog-to-digital converter for digitizing the sample signal to produce the reflected-light reference sample.

24. The apparatus of claim 16, wherein the laser-optical system comprises a mode-locked-laser source 602 for producing a train of pulses and an optical modulator 608 responsive to a timing generator 680 for selecting the probe-laser pulse from the train of pulses, and wherein the apparatus further comprises a timing generator 680 for providing a signal MLMod to control the optical modulator and for providing an adjustable clock signal to adjust phase relationship of the pattern of test vectors relative to the train of pulses.

25. The apparatus of claim 24, wherein operation of the mode-locked-laser source is synchronized to a fixed clock signal, and wherein the timing generator 680 comprises an oscillator 702 for generating the fixed clock signal and a variable-frequency source 710 for deriving the adjustable clock signal from the fixed clock signal.

26. The apparatus of claim 16, a incident-power-compensation subsystem 632, 662, 670, 672, 674, 676, 678 for compensating variations in incident power level of the probe-laser pulse and of the reference-laser pulse.

27. The apparatus of claim 26, wherein the incident-power-compensation subsystem comprises a beam splitter 632 for diverting a portion of light from the probe-laser pulse and the reference-laser pulse, an incident-beam detector 670 for detecting energy level of the diverted light to produce an incident-beam detector signal, an integrator 832 for integrating the incident-beam detector signal during a probe-gate period 844, and an integrator 822 for integrating the incident-beam detector signal during a reference-gate period 834.

28. The apparatus of claim 27, wherein the incident-power-compensation subsystem further comprises circuits 824, 828, 834, 838 for sampling and digitizing the integrated incident-beam detector signal to produce incident-power data representing detected incident-energy level of the probe-laser pulse and of the reference-laser pulse.

29. The apparatus of claim 19, wherein the optical modulator 608 selects the probe-laser pulse from said train of pulses by suppressing unwanted pulses from the train of pulses.

30. The apparatus of claim 29, wherein the optical modulator 608 passes vestigial pulses when suppressing unwanted pulses, and wherein the reflected-power detection system detects energy reflected from the region as the reference-laser pulse is applied by detecting energy from the region during a time reference-gate interval 834 which includes a selected number of said vestigial pulses.

* * * * *